(12) United States Patent
Zhang et al.

(10) Patent No.: US 10,790,347 B2
(45) Date of Patent: Sep. 29, 2020

(54) DISPLAY DEVICE AND VIA-HOLE ELECTRICAL CONNECTION STRUCTURE

(71) Applicant: BOE TECHNOLOGY GROUP CO., LTD., Beijing (CN)

(72) Inventors: Yuxin Zhang, Beijing (CN); Hongfei Cheng, Beijing (CN); Xinyin Wu, Beijing (CN); Yong Qiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/759,339

(22) PCT Filed: Aug. 15, 2017

(86) PCT No.: PCT/CN2017/097524
§ 371 (c)(1),
(2) Date: Mar. 12, 2018

(87) PCT Pub. No.: WO2018/107788
PCT Pub. Date: Jun. 21, 2018

(65) Prior Publication Data
US 2019/0189729 A1    Jun. 20, 2019

(30) Foreign Application Priority Data
Dec. 16, 2016    (CN) .......................... 2016 1 1169180

(51) Int. Cl.
*H01L 27/32*    (2006.01)
*H01L 51/52*    (2006.01)
(Continued)

(52) U.S. Cl.
CPC ....... *H01L 27/3276* (2013.01); *G09G 3/3208* (2013.01); *H01L 27/3248* (2013.01);
(Continued)

(58) Field of Classification Search
CPC . H01L 27/32; H01L 27/3202; H01L 27/3206; H01L 27/3223; H01L 27/3225;
(Continued)

(56) References Cited

U.S. PATENT DOCUMENTS 6,633,134 B1 * 10/2003 Kondo ................. G09G 3/3225
313/504
6,690,032 B1    2/2004 Umetsu
(Continued)

FOREIGN PATENT DOCUMENTS

CN    103022051 A    4/2013
CN    104795425 A    7/2015
(Continued)

OTHER PUBLICATIONS

International Search Report dated Nov. 15, 2017.
(Continued)

*Primary Examiner* — Natalia A Gondarenko
(74) *Attorney, Agent, or Firm* — Dilworth & Barrese, LLP.; Michael J. Musella, Esq.

(57) ABSTRACT

A display device and a via-hole electrical connection structure are provided. The display device includes a substrate, a light-emitting device on the substrate and in a display region, and a circuit board at a side of the substrate away from the light-emitting device; and the display device further includes a via hole passing through the substrate, and the circuit board is electrically connected with the light-emitting device through the via hole.

17 Claims, 5 Drawing Sheets

(51) Int. Cl.
   *H01L 51/56* (2006.01)
   *H01L 51/00* (2006.01)
   *G09G 3/3208* (2016.01)
(52) U.S. Cl.
   CPC ...... *H01L 51/0021* (2013.01); *H01L 51/0096* (2013.01); *H01L 51/52* (2013.01); *H01L 51/5221* (2013.01); *H01L 51/5225* (2013.01); *G09G 2300/0426* (2013.01)
(58) Field of Classification Search
   CPC ............. H01L 27/3237; H01L 27/3244; H01L 27/3251; H01L 27/3253; H01L 27/3258; H01L 27/3262; H01L 27/3267; H01L 27/3276; H01L 27/3279; H01L 27/3286; H01L 27/3288; H01L 27/3297; H01L 51/0096; H01L 51/0508; H01L 51/0575; H01L 51/102; H01L 51/107; H01L 51/44; H01L 51/441; H01L 51/442; H01L 51/445; H01L 51/448; H01L 51/50; H01L 51/5012; H01L 51/5203; H01L 51/5206; H01L 51/5209; H01L 51/5221; H01L 51/5225–5234; H01L 51/5237; H01L 51/524; H01L 51/5246; H01L 51/5253; H01L 2251/50; H01L 2251/53; H01L 2251/5315; H01L 2251/5338; H01L 2924/12044
   USPC ................. 257/40, 99, 88, 98, 100, E51.018
   See application file for complete search history.

(56) References Cited

U.S. PATENT DOCUMENTS

| | | | |
|---|---|---|---|
| 7,511,381 B2* | 3/2009 | Noguchi | H01L 21/2026 257/780 |
| 7,675,233 B2* | 3/2010 | Lee | H01L 27/3276 313/506 |
| 8,902,597 B2 | 12/2014 | Sato | |
| 9,112,181 B2* | 8/2015 | Yamae | H05B 33/04 |
| 9,504,124 B2 | 11/2016 | Kim et al. | |
| 10,225,963 B2* | 3/2019 | Lee | G02F 1/133305 |
| 2003/0168969 A1 | 9/2003 | Tanabe | |
| 2006/0087224 A1* | 4/2006 | Oki | H01L 27/3276 313/504 |
| 2009/0050883 A1* | 2/2009 | Hayashi | H01L 51/5237 257/40 |
| 2009/0302760 A1* | 12/2009 | Tchakarov | H01L 51/5203 313/512 |
| 2013/0306952 A1* | 11/2013 | Yamae | H01L 51/5212 257/40 |
| 2014/0184057 A1 | 7/2014 | Kim et al. | |
| 2014/0319496 A1 | 10/2014 | Kim et al. | |
| 2015/0179727 A1* | 6/2015 | Kim | H01L 27/3276 257/40 |
| 2015/0221712 A1 | 8/2015 | Yu et al. | |
| 2016/0336532 A1 | 11/2016 | Li | |
| 2018/0110122 A1* | 4/2018 | Lee | H05K 1/14 |
| 2018/0158875 A1 | 6/2018 | Dong et al. | |

FOREIGN PATENT DOCUMENTS

| | | |
|---|---|---|
| CN | 105789225 A | 7/2016 |
| CN | 105870159 A | 8/2016 |
| CN | 206301796 U | 7/2017 |
| JP | 2001092381 A | 4/2001 |
| JP | 2012118341 A | 6/2012 |
| KR | 1020010092711 A | 10/2001 |
| KR | 1020150102072 A | 9/2015 |
| WO | 2012102194 A1 | 8/2012 |

OTHER PUBLICATIONS

First Korean Office Action dated Aug. 1, 2019.
Korean Office Action dated Feb. 27, 2020.
European Search Report dated Jun. 23, 2020.

* cited by examiner

DISPLAY DEVICE AND VIA-HOLE ELECTRICAL CONNECTION STRUCTURE

TECHNICAL FIELD

Embodiments of the present disclosure relate to a display device and a via-hole electrical connection structure.

BACKGROUND

Compared with a liquid crystal display device, an organic light-emitting diode (OLED) display device has advantages of self-luminescence, fast response, wide viewing angle, high brightness, vivid colors, thin and light weight and so on, and the OLED display device is considered as a representative of a next generation of display technology. A self-luminous element in the OLED display device is an OLED device, and the OLED device mainly includes an anode, a light-emitting functional layer and a cathode which are on a substrate. The cathode of the OLED device is connected to a printed circuit board (PCB for short) through a wire, for example. However, such wiring structure is complicated and the process flow is difficult to be simplified.

SUMMARY

Embodiments of the present disclosure relate to a display device and a via-hole electrical connection structure, and the embodiments of the present disclosure simplify the process flow of the display device.

At least one embodiment of the present disclosure provides a display device, the display device includes a substrate, a light-emitting device on the substrate, a circuit board at a side of the substrate away from the light-emitting device, and a via hole passing through the substrate, and the circuit board is electrically connected with the light-emitting device through the via hole.

For example, the display device further includes an insulating layer on the substrate, the light-emitting device is on the insulating layer, the circuit board is at the side of the substrate away from the insulating layer, and the via hole further passes through the insulating layer.

For example, the insulating layer is a planarization layer, and a surface, supporting the light-emitting device, of the planarization layer is flat.

For example, the light-emitting device includes a cathode, and the circuit board is electrically connected with the cathode through the via hole.

For example, the display device further includes a conductive component which is in contact with the cathode, and at least a portion of the conductive component is in the via hole.

For example, the display device includes a display region and a non-display region at a periphery of the display region, the conductive component is in the via hole, and the cathode is in contact with the conductive component through an extending portion, extending into the non-display region, of the cathode.

For example, the display device includes a display region and a non-display region at a periphery of the display region, the conductive component includes a first portion in the via hole and a contact electrode located on the via hole, the first portion and the contact electrode are in contact with each other, and the cathode is in contact with the contact electrode through an extending portion, extending into the non-display region, of the cathode.

For example, the light-emitting device further includes an anode, and the display device further includes an isolation component that isolates the extending portion of the cathode from the anode.

For example, a material of the isolation component includes an insulating polymer material.

For example, a first end of the conductive component is in the via hole, and a second end of the conductive component overlaps and connects the cathode.

For example, the conductive component includes a first portion in the via hole, a contact electrode which is on the via hole and is in contact with the first portion, and a second portion which overlaps and connects the cathode and is in contact with the contact electrode.

For example, the circuit board is a printed circuit board.

For example, the substrate is a monocrystalline silicon chip integrated with a driver circuit.

For example, a material of the conductive component includes at least one of the group selected from aluminum, copper, silver, gold, platinum, nickel or molybdenum.

For example, a material of the conductive component and a material of the cathode are same.

For example, a thickness of a region, provided with the via hole, of the insulating layer is smaller than a thickness of a remaining region of the insulating layer; or a thickness of a region, provided with the via hole, of the substrate is smaller than a thickness of a remaining region of the substrate; or the thickness of the region, provided with the via hole, of the insulating layer is smaller than the thickness of the remaining region of the insulating layer, and the thickness of the region, provided with the via hole, of the substrate is smaller than the thickness of the remaining region of the substrate.

For example, the light-emitting device includes an anode, a light-emitting functional layer and an anode, and a cathode, and a distance from the cathode to the insulating layer is greater than a distance from the light-emitting functional layer to the insulating layer which is greater than a distance from the anode to the insulating layer.

For example, the display device further includes an encapsulation layer covering the light-emitting device.

For example, the display device further includes a transparent covering plate at a side of the encapsulation layer away from the circuit board.

For example, the display device is an organic light-emitting display device, and the light-emitting device is an organic light-emitting device.

For example, the display device includes a display region and a non-display region at a periphery of the display region, and the via hole is in the non-display region.

For example, the display device further includes an edge connection component at an edge of the substrate, and the edge connection component connects the circuit board with the cathode.

At least one embodiment of the present disclosure further provides a via-hole electrical connection structure, which includes: a substrate; a component to be connected on the substrate; a circuit board at a side of the substrate away from the component to be connected; and a via hole passing through the substrate, the circuit board being electrically connected with the component to be connected through the via hole.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the present disclosure.

REFERENCE NUMERALS

01—display device; 10—substrate; 10A—outside surface of the substrate; 11—via hole; 20—insulating layer; 20A—surface of the insulating layer; 30—light-emitting device; 31—anode; 32—light-emitting functional layer; 33—cathode; 33a—extending portion; 40—circuit board; 50—conductive component; 51—first portion; 52—contact electrode; 53—second portion; 60—isolation component; 70—encapsulation layer; 80—transparent covering plate; 90—edge connection component; 91—horizontal portion; 92—inclined portion; 30'—signal line; and 03—component to be connected.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. The terms "on," "under," "right," "left" and the like are only used to indicate relative position relationship, and when the position of the object which is described is changed, the relative position relationship may be changed accordingly.

For the purpose of clarity, unless otherwise indicated, the size of each structure in the drawings of the embodiments of the present disclosure is exaggerated, which does not represent an actual size and ratio.

At least one embodiment of the present disclosure provides a display device, and the display device includes: a substrate; a light-emitting device on the substrate; a circuit board at a side of the substrate away from the light-emitting device (namely the circuit board and the light-emitting device are located at two opposite sides of the substrate respectively); and a via hole which passes through the substrate and through which the circuit board is electrically connected with the light-emitting device.

For example, the display device includes a display region and a non-display region at a periphery of the display region, and the light-emitting device is in the display region or the non-display region of the display device.

For example, the via hole is in the display region of the display device, or in the non-display region at the periphery of the display region.

For example, the light-emitting device includes a cathode, and the circuit board is electrically connected with the cathode by the via hole.

The light-emitting device, for example, is in direct contact with the substrate or an insulating layer is further disposed between the substrate and the light-emitting device. For example, the display device provided by at least one embodiment of the present disclosure further includes the insulating layer on the substrate, the light-emitting device is on the insulating layer, the circuit board is at the side of the substrate away from the insulating layer, and the via hole further passes through the insulating layer.

For example, the insulating layer is a planarization layer having a planarization effect.

As illustrated in FIG. 1A to FIG. 8C, each of the embodiments of the present disclosure provides a display device 01 (for example, an organic light-emitting diode display device, short for an OLED display device), and the display device 01 includes a substrate 10, an insulating layer 20 on the substrate 10, a light-emitting device 30 (for example, an organic light-emitting diode device, short for an OLED device) on the insulating layer 20 and in a display region (labeled AA in the figures), and a circuit board 40 at a side of the substrate 10 away from the insulating layer 20. The display device 01 further includes a via hole 11 (for example, two via holes are shown in figures) passing through the insulating layer 20 and the substrate 10. For example, the via hole 11 is located in a non-display region at a periphery of the display region AA. The circuit board 40 is electrically connected with the cathode 33 of the light-emitting device 30 through the via hole 11.

For example, the display device provided by at least one embodiment of the present disclosure is an organic light-emitting diode display device, accordingly, the light-emitting device is an organic light-emitting diode device. For example, the display device may also be other type of active light-emitting display device, for example, a light-emitting diode (LED) display device (the light-emitting device is an LED device), or an inorganic light-emitting display device (the light-emitting device is a quantum dot light-emitting diode, which is short for QLED).

For example, the insulating layer 20 is a planarization layer, and a surface 20A, supporting the light-emitting device 30, of the planarization layer is flat. For example, a material of the insulating layer 20 includes an organic material or an inorganic material, so that the surface which is flat is obtained, and thus the insulating layer 20 plays a role of planarization.

It should be noted that, firstly, the substrate 10, for example, is an array substrate, in which a plurality of thin film transistors (TFTs) arranged in an array are formed.

The substrate 10 is, for example, a monocrystalline silicon chip integrated with a driver circuit, that is to say, the substrate 10 is a monocrystalline silicon chip that can realize the function of the driver circuit. The monocrystalline silicon chip, for example, adopts an integrated circuit complementary metal-oxide semiconductor (CMOS) process, which can realize that the monocrystalline silicon chip is integrated with a driving control circuit being able to realize a variety of functions, such as a T-CON (namely, a logic board or a central control board), to control display. In a case that the above-mentioned display device 01 adopts the monocrystalline silicon chip as the substrate, its pixel size may be 1/10 or smaller than 1/10 of the pixel size of the display device based on the TFT array substrate, in this way, the display precision is much higher than that of the display device based on the TFT array substrate. Therefore, the above display device 01 provided in any one of the embodiments of the present disclosure preferably adopts the monocrystalline silicon chip as the substrate.

Secondly, the light-emitting device 30 described above, for example, includes an anode 31, a light-emitting functional layer 32, and a cathode 33. As illustrated in FIG. 1A to FIG. 7, a region corresponding to the anode 31 is the display region AA, a region outside the region corresponding to the anode 31 is the non-display region. For example, in order to facilitate the electrical connection between the anode 31 and the TFT array substrate or the monocrystalline silicon chip, the anode 31 is located below the light-emitting functional layer 32 and the cathode 33 is located on the light-emitting functional layer 32.

For example, the light-emitting functional layer 32 further includes structural layers such as a hole injection layer, a hole transport layer, an electron blocking layer, a light-emitting layer, a hole blocking layer, an electron injection layer, and an electron transport layer. For example, each of the layers is made of organic small molecule material or organic polymer material, or inorganic material, composite doped material or the like.

Thirdly, the circuit board 40 transmits a cathode signal to the cathode 33 through the via hole 11. A region of the circuit board 40 exposed by the via hole 11 is the region of a corresponding unit of the circuit board 40 that provides the cathode signal. The position of the via hole 11 may be flexibly arranged according to the factors such as the configuration of the circuit board 40 (for example, a printed circuit board, namely a PCB) and the size of the display device and the size of the circuit board 40, which is not limited in the embodiments of the present disclosure, as long as the cathode 33 receives the cathode signal provided by the circuit board 40 through the via hole 11.

The number of the via hole 11 is not limited in the embodiments of the present disclosure. For example, a plurality of via holes 11 is provided to avoid that a poor contact between the cathode 33 and the circuit board 40 occurs in a case of only one via hole being provided and affects the cathode 33 normally receiving the cathode signal provided by the circuit board 40.

In the embodiments of the present disclosure, because the via hole 11 is located in the non-display region at the periphery of the display region AA, and because a portion, corresponding to the non-display region, of the TFT array substrate or of the monocrystalline silicon chip usually includes a layer of insulating layer or a plurality of insulating layers, the via hole 11 provided in the non-display region does not affect the normal operation of the TFT array substrate or the monocrystalline silicon chip. For example, the process of forming the via hole 11 may be any patterning processes (namely a process for forming a pattern), for example, a laser penetration process.

As described above, in the above display device 01 provided by any one of the embodiments of the present disclosure, the cathode 33 is electrically connected to the circuit board 40 through the via hole 11 passing through the insulating layer 20 and the substrate 10 in the non-display region to receive the cathode signal from the circuit board 40. Therefore, the embodiments of the present disclosure do not require additional wire around the light-emitting device, which simplifies the process of the display device.

Figure 6:
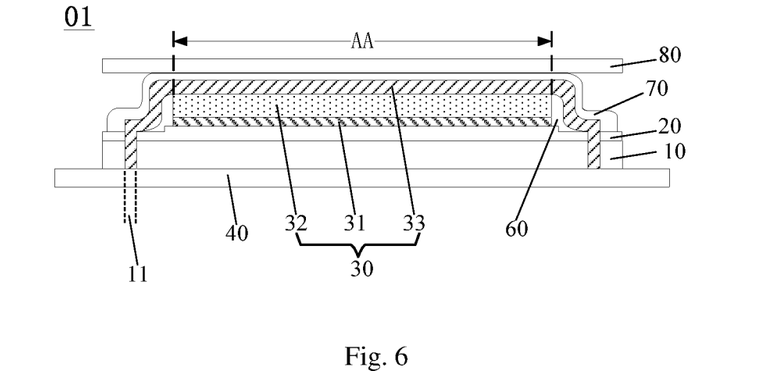
FIG. 6 is a seventh schematic view of the structure of the display device provided by the embodiments of the present disclosure.
Figure 7:
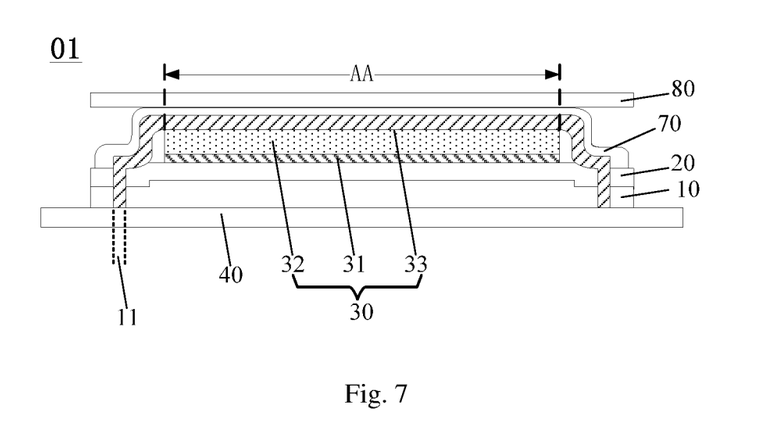
FIG. 7 is an eighth schematic view of the structure of the display device provided by the embodiments of the present disclosure.

For example, on the basis of any one of the above embodiments, in order to reduce the offset (namely mismatch gap) at the via hole and ensure the reliability of the electrical connection between the cathode 33 and the circuit board 40, a thickness of a region, provided with the via hole 11, of the insulating layer 20 is smaller than a thickness of a remaining region of the insulating layer 20 (namely the rest region of the insulating layer 20 except the region provided with the via hole 11), for example, a thickness of a portion of the insulating layer 20 corresponding to at least a portion of the non-display region is smaller than a thickness of a portion of the insulating layer 20 corresponding to the display region AA, as illustrated in FIG. 6; and/or, a thickness of a region, provided with the via hole 11, of the substrate 10 is smaller than a thickness of a remaining region of the substrate 10 (namely the rest region of the substrate 10 except the region provided with the via hole 11), for example, a thickness of a portion of the substrate 10 corresponding to at least a portion of the non-display region is smaller than a thickness of a portion of the substrate 10 corresponding to the display region AA, as illustrated in FIG. 7.

For example, the thickness of the corresponding region of the insulating layer 20 and/or the thickness of the corresponding region of the substrate 10 may be thinned by a thinning process (such as by a plasma bombardment method), which facilitates the forming of the via hole 11.

For example, with reference to FIG. 1A to FIG. 4, the display device 01 provided by at least one embodiment of the present disclosure further includes an encapsulation layer 70 covering the light-emitting device 30 and a transparent covering plate 80 at a side of the encapsulation layer 70 away from the circuit board 40. For example, the encapsulation layer 70 is a stack of an inorganic material layer and an organic material layer, and an edge of the encapsulation layer 70 surrounds the light-emitting device 30, the encapsulation layers 70 surrounding different light-emitting devices are spaced apart from each other and the encapsulation layer 70 is configured to prevent water and oxygen in the outside from entering the light-emitting device 30 encapsulated by the encapsulation layer 70.

Figure 1A:
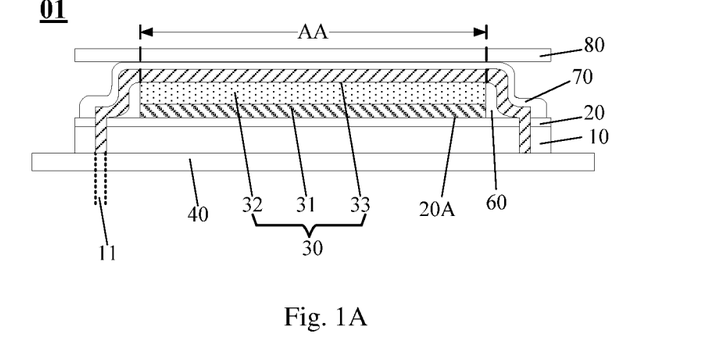
FIG. 1A is a first schematic view of a structure of a display device provided by embodiments of the present disclosure.
Figure 1B:
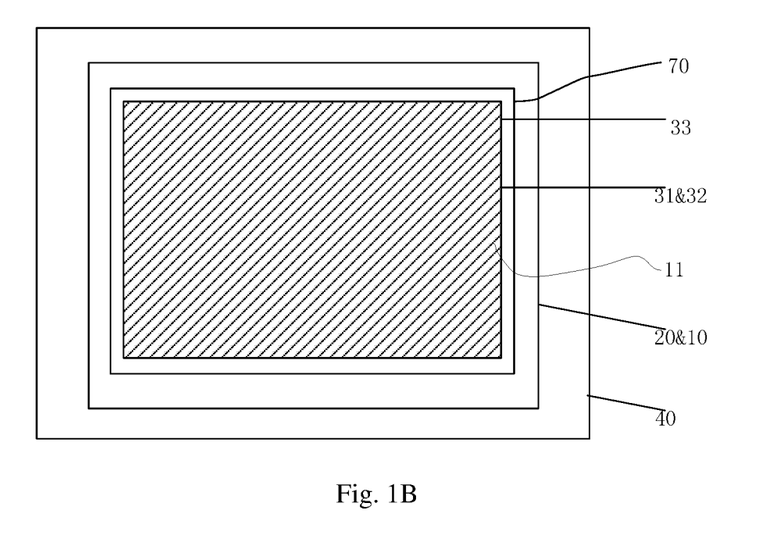
FIG. 1B is a schematic plan view of a portion of the structure in FIG. 1A.

For example, the manner that the cathode 33 is electrically connected with the circuit board 40 may be as illustrated in FIG. 1A, that is, the cathode 33 covers the light-emitting functional layer 32, extends to a region provided with the via hole 11 and fills the via hole 11.

For example, the cathode 33 includes a portion extending into the non-display region, and an isolation component 60 is provided between the portion of the cathode 33 extending into the non-display region and the anode 31, so as to avoid that the cathode 33 contacts the anode 31 to cause a short circuit of the light-emitting device 30.

Figure 2A:
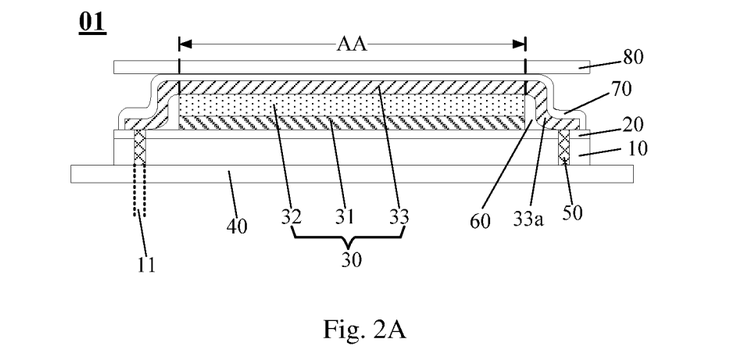
FIG. 2A is a second schematic view of the structure of the display device provided by the embodiments of the present disclosure.
Figure 2B:
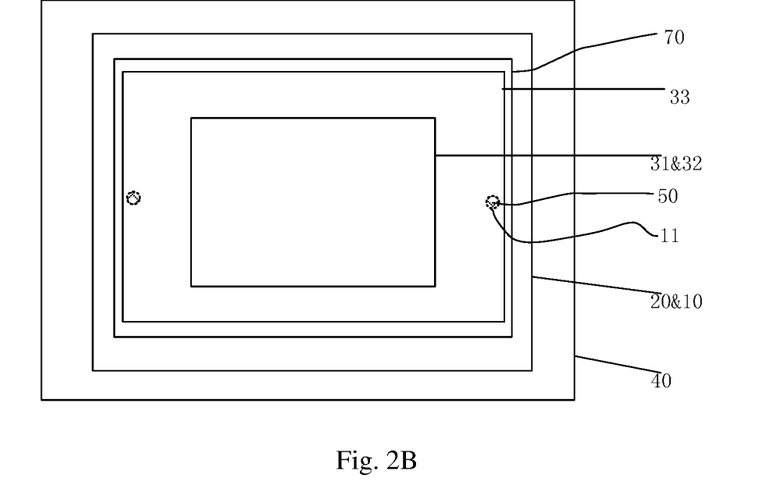
FIG. 2B is a schematic plan view of a portion of the structure in FIG. 2A.

The via hole 11 needs to pass through the insulating layer 20 and the substrate 10, the offset at the via hole 11 is relatively large and the thickness of the cathode 33 is small, so in a case that a material of the cathode is filled into the via hole 11 directly, it is possible that the material of the cathode does not fill the entire via hole 11, that is, the cathode 33 may have a poor contact with the circuit board 40 (for example, PCB). Therefore, with reference to FIG. 2A to FIG. 5, the display device 01 provided by at least one embodiment of the present disclosure further includes a conductive component 50 which is in contact with the cathode 33, and at least a portion of the conductive component 50 is in the via hole 11 to connect the cathode 33 with the circuit board 40. For example, as illustrated in FIG. 2A and FIG. 2B, the entire conductive component 50 is located in a coverage region of the encapsulation layer 70; and for example, the entire conductive component 50 is located in a coverage region of the cathode 33.

For example, the conductive component 50 may be made of at least one of the group selected from aluminum, copper, silver, gold, platinum, nickel or molybdenum, which has a good electrical conductivity; or the conductive component 50 and the cathode 33 are made of a same material (for example, magnesium silver alloy, or lithium aluminum alloy, or the like).

For example, in a case that the anode 31 in the light-emitting device 30 is located below the cathode 33, in order to simplify the manufacturing process of the conductive component 50, the conductive component 50 at least a portion of which is filled in the via hole 11 is formed in a same patterning process of forming the anode 31 of the light-emitting device. That is, the conductive component 50 is formed by a film that forms the anode 31.

The following provides four embodiments of the conductive component 50 for describing the above-mentioned display device 01 in detail.

Figure 3A:
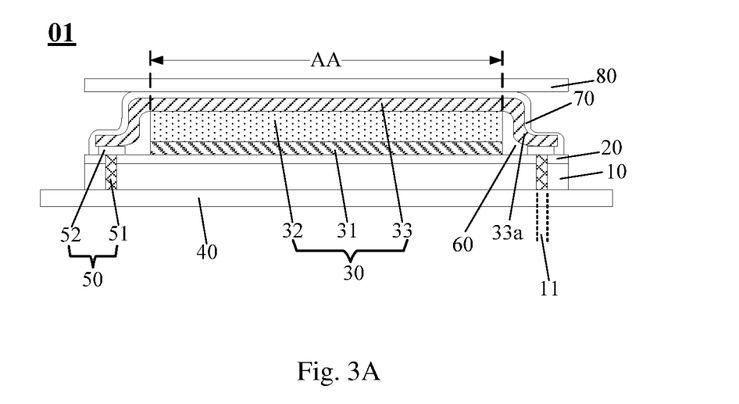
FIG. 3A is a third schematic view of the structure of the display device provided by the embodiments of the present disclosure.
Figure 3B:
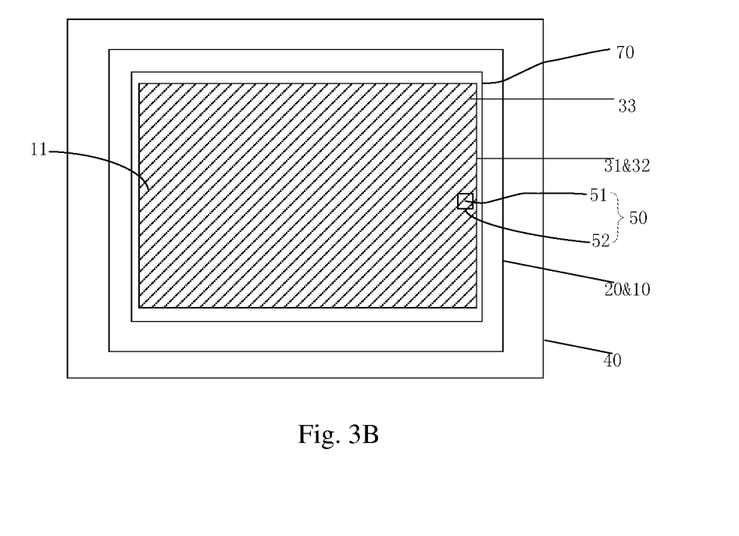
FIG. 3B is a schematic plan view of a portion of the structure in FIG. 3A.

With reference to the embodiment shown in FIG. 3, the conductive component 50 is located in the via hole 11 passing through the substrate 10 and the insulating layer 20; and the cathode 33 contacts the conductive component 50 through an extending portion 33a of the cathode extending into the non-display region. In order to avoid the short circuit of the light-emitting device 30 caused by the contact between the extending portion 33a of the cathode 33 and the anode 31 disposed below the cathode 33, the display device 01 further includes an isolation component 60 that isolates the extending portion 33a of the cathode 33 from the anode 31.

For example, the isolation component 60 is made of insulating polymer material. For example, the isolation component 60 is made of a photoresist material so that the isolation component 60 is formed in a corresponding region through the process of exposure and development, without an additional etching process, to further simplify the manufacturing process of the display device.

For example, the isolation component 60 is formed in the process of forming a pixel defining layer (short for PDL) for defining pixel units in the display device 01, that is, the isolation component 60 is formed by a film for forming the pixel defining layer.

With reference to the embodiment shown in FIG. 3, the conductive component 50 includes a first portion 51 in the via hole 11 and a contact electrode 52 located on the via hole 11, and the cathode 33 contacts the contact electrode 52 through the extending portion 33a extending into the non-display region. For example, in order to avoid the short circuit of the light-emitting device 30 caused by the contact between the extending portion 33a of the cathode 33 and the anode 31 disposed below the cathode 33, the display device 01 further includes the isolation component 60 that isolates the extending portion 33a of the cathode 33 from the anode 31.

In the present embodiment, the added contact electrode 52 further ensures the reliability of the connection between the cathode 33 and the circuit board 40.

For example, the isolation component 60 is made of insulating polymer material. For example, the isolation component 60 is made of a photoresist material so that the isolation component 60 is formed in the corresponding region through the process of exposure and development, without an additional etching process, to further simplify the manufacturing process.

For example, the isolation component 60 is formed in the process of forming the pixel defining layer (short for PDL) for defining the pixel units in the display device 01.

Figure 4:
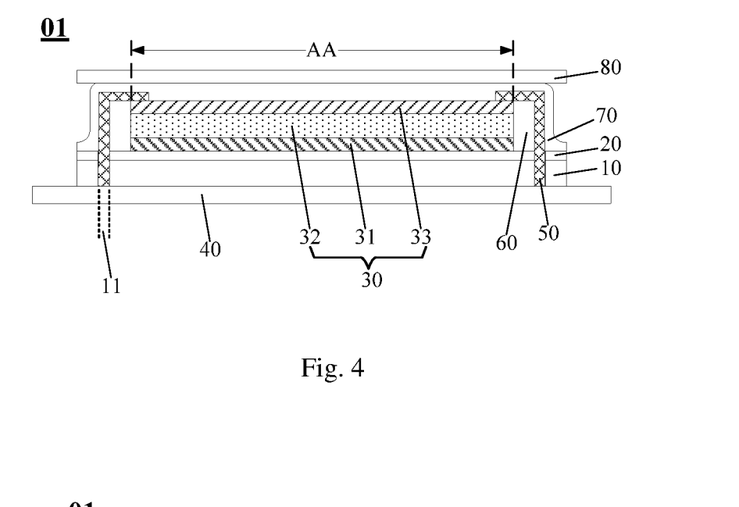
FIG. 4 is a fourth schematic view of the structure of the display device provided by the embodiments of the present disclosure.

With reference to the embodiment shown in FIG. 4, a first end of the conductive component 50 is in the via hole 11, and a second end of the conductive component 50 overlaps and connects the cathode 33 (that is, the second end of the conductive component 50 is in direct contact with the cathode 33), so that the cathode 33 is electrically connected with the circuit board 40 by the conductive component 50.

For example, in a direction parallel to the circuit board 40, the isolation component 60 is formed between the conductive component 50 and the anode 31 to prevent the conductive component 50 from contacting the anode 31.

Figure 5A:
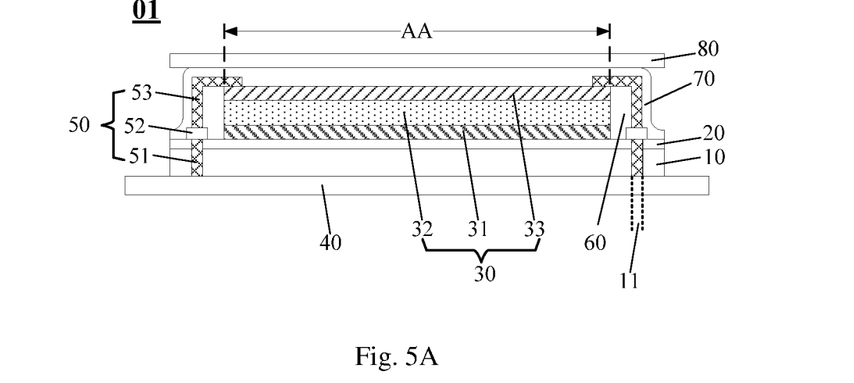
FIG. 5A is a fifth schematic view of the structure of the display device provided by the embodiments of the present disclosure.
Figure 5B:
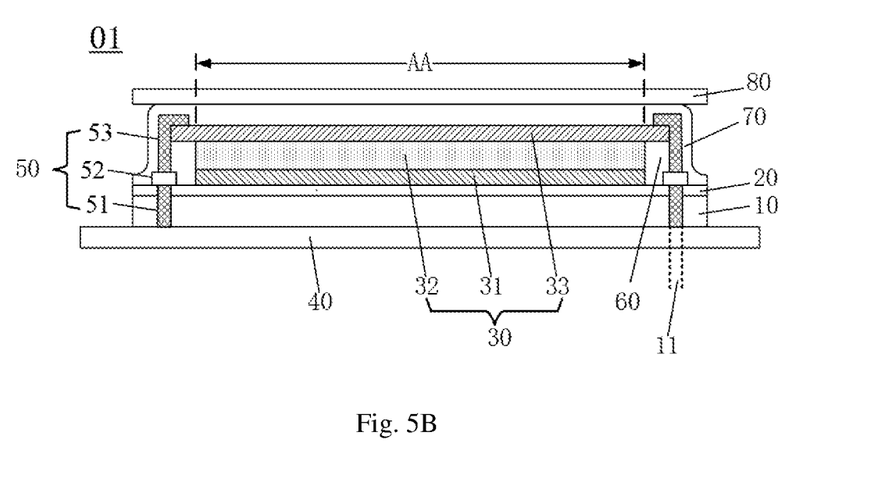
FIG. 5B is a sixth schematic view of the structure of the display device provided by the embodiments of the present disclosure.

With reference to the embodiments shown in FIGS. 5A and 5B, the conductive component 50 includes a first portion 11 in the via hole, a contact electrode 52 which is located on the via hole 11 and contacts the first portion 11, and a second portion 53 which overlaps and connects the cathode 33 and contacts the contact electrode 52. For example, both the first portion 51 and the contact electrode 52 are located in the non-display region; and the second portion 53 includes a portion located in the non-display region and a portion which extends into the display region and is in direct contact with the cathode 33 (as shown in FIG. 5A), or, the entire second portion 53 is located in the non-display region and the second portion 53 is in direct contact with the portion of the cathode 33 extending into the non-display region (as shown in FIG. 5B).

In the present embodiment, the added contact electrode 52 further ensures the reliability of the connection between the cathode 33 and the circuit board 40.

For example, in the direction parallel to the circuit board 40, the isolation component 60 is formed between the conductive component 50 and the anode 31 to prevent the anode 31 from contacting the contact electrode 52 and the second portion 53 of the conductive component 50.

Figure 8A:
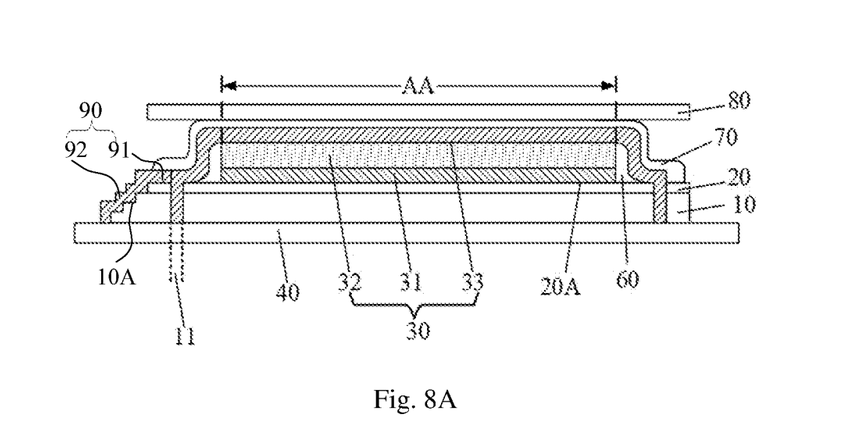
FIG. 8A to FIG. 8C are schematic views of the structure of the display device including an edge connection component provided by the embodiments of the present disclosure.
Figure 8B:
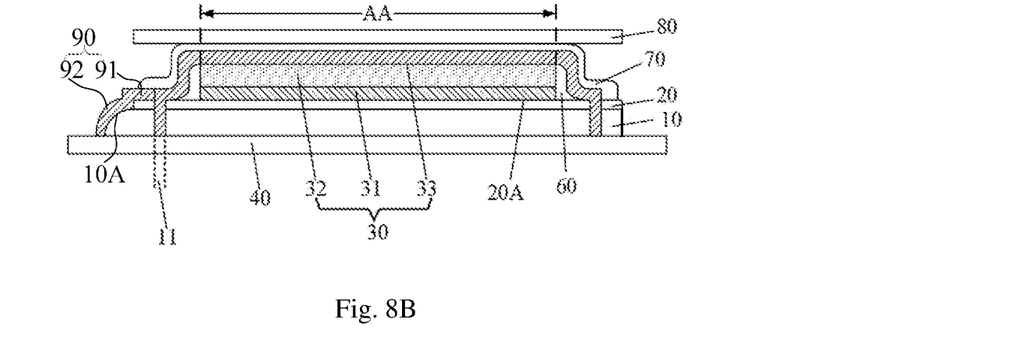
Figure 8C:
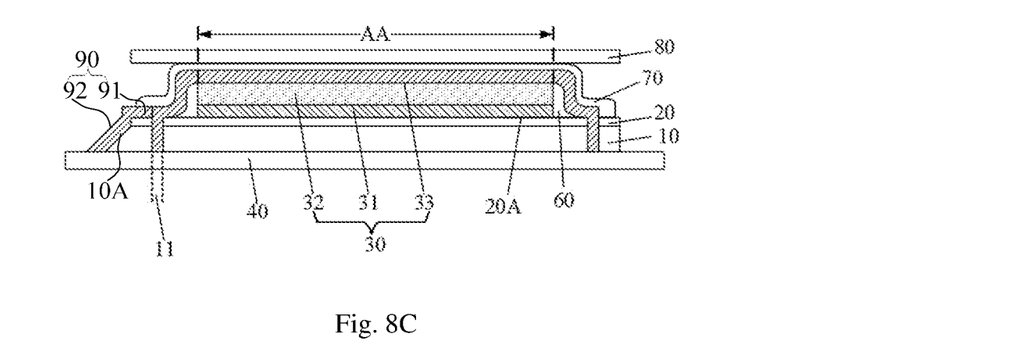

For example, on the basis of any one of the above embodiments, the display device further includes a connection component which connects together the circuit board 40 and the cathode 33 and crosses an outer lateral surface of the substrate 10 to further ensure the reliability of the connection between the circuit board 40 and the cathode 33. For example, as illustrated in FIG. 8A to FIG. 8C, the display device 01 further includes an edge connection component 90 at an edge of the substrate 10, a first end of the edge connection component 90 is in connect with the cathode 33 at the via hole 11, and a second end of the edge connection component 90 is in connect with the circuit board 40. For example, in the non-display region, the edge connection component 90 connects the extending portion of the cathode 33. For example, the edge connection component 90 includes a horizontal portion 91 covering a portion of an upper surface of the substrate 10 and an inclined portion 92 covering the outer lateral surface 10A of the substrate 10. For example, the inclined portion 92 is in an arc shape, a stepped shape or a planar shape. For example, the outer lateral surface 10A of the substrate 10 is also correspondingly in the arc shape, the stepped shape or the planar shape.

Figure 9A:
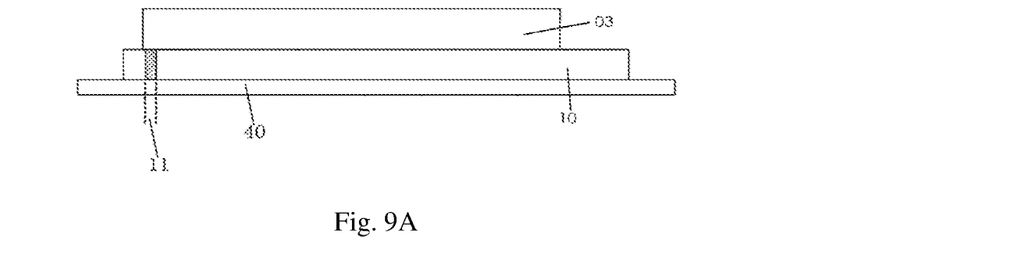
FIG. 9A is a schematic view of a via-hole electrical connection structure provided by the embodiments of the present disclosure.

As illustrated in FIG. 9A, at least one embodiment of the present disclosure further provides a via-hole electrical connection structure, and the via-hole electrical connection structure includes a substrate 10, a component to be connected 03 on the substrate 10 and a circuit board 40 at a side of the substrate 10 away from the component to be connected 03 (that is, the circuit board 40 and the component to be connected 03 are located at two sides of the substrate 10 respectively). The via-hole electrical connection structure further includes a via hole 11 passing through the substrate 10, and the circuit board 40 is electrically connected with the component to be connected 03 through the via hole 11.

Figure 9B:
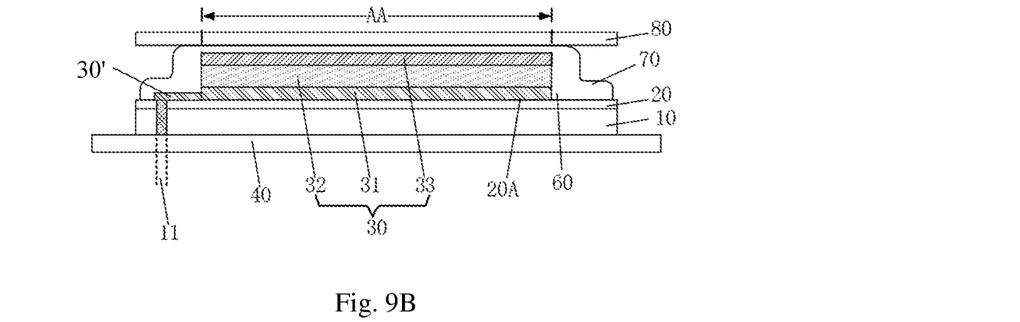
FIG. 9B is a schematic view of the structure of the display device in which a signal line and a circuit board are connected by a via hole provided by the embodiments of the present disclosure.

For example, the component to be connected 03 is a signal line 30', as illustrated in FIG. 9B. For example, the signal line 30' is a source signal line, a gate line or a data line or the like in the display device.

The descriptions of the same parts in the above embodiments may be referred to each other.

What are described above is related to the illustrative embodiments of the disclosure only and not limitative to the scope of the disclosure, the scopes of the disclosure are defined by the accompanying claims.

The present application claims the priority of the Chinese Patent Application No. 201611169180.1 filed on Dec. 16, 2016, the entirety of which is incorporated herein by reference as a part of the present application.

What is claimed is:

1. A display device, comprising:
a substrate;
a light-emitting device on the substrate;
a circuit board at a side, away from the light-emitting device, of the substrate; and
a via hole passing through the substrate, wherein the circuit board is electrically connected with the light-emitting device through the via hole,
wherein an entire orthographic projection of the substrate on the circuit board is within a region where the circuit board is located;
the light-emitting device comprises a cathode, the circuit board is electrically connected with the cathode through the via hole, an end of the cathode passes through the via hole and then directly contacts the circuit board, and an orthographic projection of the cathode on the substrate overlaps the via hole;
the display device further comprises an edge connection component at an edge of the substrate and comprises an encapsulation layer; the edge connection component comprises a horizontal portion covering a portion of an upper surface of the substrate and an inclined portion covering an outer lateral surface of the substrate, the horizontal portion has an end that directly contacts the cathode at the via hole, the encapsulation layer covers the light-emitting device, and the encapsulation layer has a surface that directly contacts and covers the end of the horizontal portion and the cathode.

2. The display device according to claim 1, further comprising an insulating layer on the substrate, wherein the light-emitting device is on the insulating layer, the circuit board is at the side of the substrate away from the insulating layer, and the via hole further passes through the insulating layer.

3. The display device according to claim 2, wherein the insulating layer is a planarization layer, and a surface, supporting the light-emitting device, of the planarization layer is flat.

4. A display device, comprising:
a substrate;
a light-emitting device on the substrate;
a circuit board at a side, away from the light-emitting device, of the substrate; and
a via hole passing through the substrate, wherein the circuit board is electrically connected with the light-emitting device through the via hole,
wherein an entire orthographic projection of the substrate on the circuit board is within a region where the circuit board is located;
the display device further comprises a conductive component which is in contact with a cathode that the light-emitting device comprises, the circuit board is electrically connected with the cathode through the via hole, and
at least a portion of the conductive component is in the via hole;
the conductive component comprises an end which is directly connected with an end of the cathode, and the end of the cathode is between the end of the conductive component and the substrate in a direction perpendicular to an upper surface, which supports the light-emitting device, of the substrate; the light-emitting device further comprises an anode which is between the cathode and the substrate in the direction of the substrate.

5. The display device according to claim 4, comprising a display region and a non-display region at a periphery of the display region, wherein the conductive component is in the via hole, and the cathode is in contact with the conductive component through an extending portion of the cathode extending into the non-display region.

6. The display device according to claim 4, comprising a display region and a non-display region at a periphery of the display region, wherein the conductive component comprises a first portion in the via hole and a contact electrode on the via hole, the first portion and the contact electrode are in contact with each other, and the cathode is in contact with the contact electrode through an extending portion of the cathode extending into the non-display region.

7. The display device according to claim 4, wherein a first end of the conductive component is in the via hole, and a second end of the conductive component overlaps and connects the cathode.

8. The display device according to claim 4, wherein the conductive component comprises a first portion in the via hole, a contact electrode which is on the via hole and is in contact with the first portion, and a second portion which overlaps and connects the cathode and is in contact with the contact electrode.

9. The display device according to claim 1,
wherein the edge connection component crosses the outer lateral surface of the substrate to connect the circuit board with the cathode;
an orthographic projection of the edge connection component on the substrate is outside an orthographic projection of an extending portion of the cathode on the substrate;
the inclined portion is inclined with respect to the circuit board, and an end of the inclined portion extends to an upper surface which is comprised by the circuit board and which faces the upper surface of the substrate.

10. The display device according to claim 1,
wherein the light-emitting device further comprises an anode, and an isolation component that isolates the cathode from the anode.

11. (Previously Presented e display device according to claim 1, wherein the circuit hoard is a printed circuit board.

12. The display device according to claim 1, wherein the substrate is a monocrystalline silicon chip integrated with a driver circuit.

13. The display device according to claim 4, wherein a material of the conductive component and a material of the cathode are same.

14. The display device according to claim 2, wherein a thickness of a region, provided with the via hole, of the insulating layer is smaller than a thickness of a remaining region of the insulating layer; or
a thickness of a region, provided with the via hole, of the substrate is smaller than a thickness of a remaining region of the substrate; or
the thickness of the region, provided with the via hole, of the insulating layer is smaller than the thickness of the remaining region of the insulating layer, and the thickness of the region, provided with the via hole, of the substrate is smaller than the thickness of the remaining region of the substrate.

15. The display device according to claim 2, wherein the light-emitting device comprises an anode and a light-emitting functional layer, and a distance from the cathode to the insulating layer is greater than a distance from the light-emitting functional layer to the insulating layer which is greater than a distance from the anode to the insulating layer.

16. The display device according to claim 1, further comprising a transparent covering plate at a side, away from the circuit board, of the encapsulation layer.

17. The display device according to claim 1, comprising a display region and a non-display region at a periphery of the display region, wherein the via hole is in the non-display region.

* * * * *